US012148470B2

(12) United States Patent
Maccarrone et al.

(10) Patent No.: US 12,148,470 B2
(45) Date of Patent: Nov. 19, 2024

(54) DRIVER CIRCUIT FOR PHASE-CHANGE MEMORY CELLS AND METHOD OF DRIVING PHASE-CHANGE MEMORY CELLS

(71) Applicant: STMicroelectronics S.r.l., Agrate Brianza (IT)

(72) Inventors: Agatino Massimo Maccarrone, Regalbuto (IT); Antonino Conte, Tremestieri Etneo (IT); Francesco Tomaiuolo, Acireale (IT); Michelangelo Pisasale, Catania (IT); Marco Ruta, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 209 days.

(21) Appl. No.: 17/814,442

(22) Filed: Jul. 22, 2022

(65) Prior Publication Data
US 2023/0021601 A1  Jan. 26, 2023

(30) Foreign Application Priority Data

Jul. 23, 2021  (IT) .................. 102021000019574

(51) Int. Cl.
*G11C 13/00* (2006.01)
(52) U.S. Cl.
CPC ...... *G11C 13/0069* (2013.01); *G11C 13/0004* (2013.01)

(58) Field of Classification Search
CPC .................. G11C 13/0069; G11C 13/0004
USPC ............................................. 365/155
See application file for complete search history.

(56) References Cited

U.S. PATENT DOCUMENTS

| 8,134,866 B2 * | 3/2012 | Bae | G11C 13/004 365/210.1 |
| 10,796,734 B1 * | 10/2020 | Lam | G11C 7/065 |
| 2008/0123395 A1 | 5/2008 | Nakai | |
| 2014/0063925 A1 | 3/2014 | Friedman et al. | |

\* cited by examiner

*Primary Examiner* — Huan Hoang
*Assistant Examiner* — Daniel J King
(74) *Attorney, Agent, or Firm* — Slater Matsil, LLP

(57) ABSTRACT

In an embodiment a circuit includes a plurality of memory cells, wherein each memory cell includes a phase-change memory storage element coupled in series with a respective current-modulating transistor between a supply voltage node and a reference voltage node, the current-modulating transistors being configured to receive a drive signal at a control terminal and to inject respective programming currents into the respective phase-change memory storage element as a function of the drive signal, a driver circuit configured to produce the drive signal at a common control node, wherein the common control node is coupled to the control terminals of the current-modulating transistors, the drive signal modulating the programming currents to produce SET programming current pulses and RESET programming current pulses and at least one current generator circuit configured to inject a compensation current for the programming currents into the common control node.

20 Claims, 5 Drawing Sheets

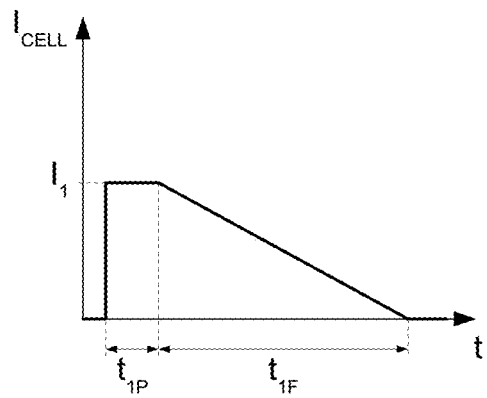
FIG. 1
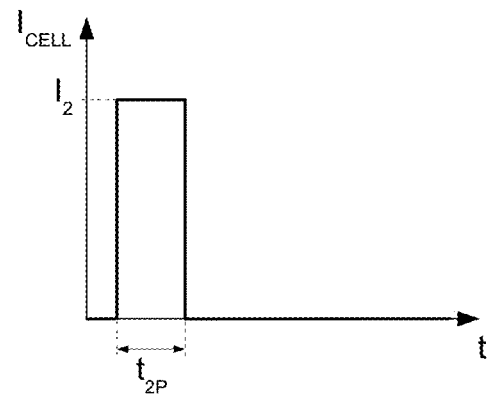
FIG. 2
FIG. 3
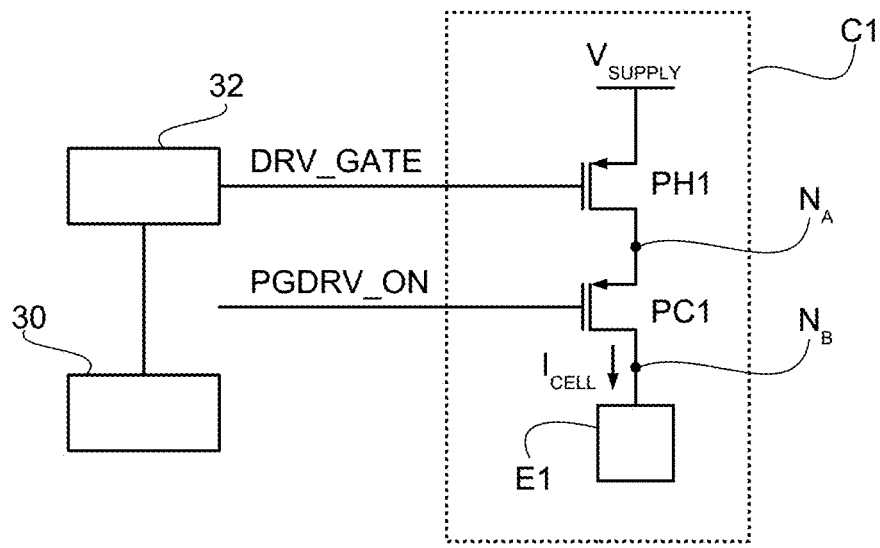
FIG. 4
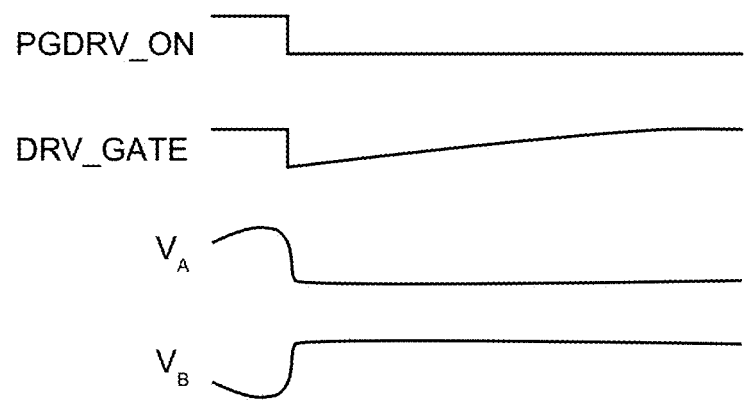

DRIVER CIRCUIT FOR PHASE-CHANGE MEMORY CELLS AND METHOD OF DRIVING PHASE-CHANGE MEMORY CELLS

CROSS-REFERENCE TO RELATED APPLICATIONS

This application claims the benefit of Italian Application No. 102021000019574, filed on Jul. 23, 2021, which application is hereby incorporated herein by reference.

TECHNICAL FIELD

The description relates to circuits and methods for driving (e.g., programming) memory cells of a phase-change memory (PCM).

BACKGROUND

Phase-change memory is a type of non-volatile memory (NVM), particularly a type of non-volatile random-access memory (RAM). The material of a conventional phase-change memory cell is typically a chalcogenure alloy comprising Germanium (Ge), Antimony (Sb) and Tellurium (Te), called GST (e.g., having composition Ge2Sb2Te5). The chalcogenure alloy is able to change phase (crystalline or amorphous) in a reversible and controlled way by means of a programming current that passes through the memory cell and induces the phase change by appropriately heating the chalcogenure alloy (i.e., the memory storage element).

Conventionally, heat produced by the passage of the programming current is used to either quickly heat and quench the alloy, making it amorphous (RESET state and RESET programming current pulse), or to hold the alloy in its crystallization temperature range for some time, thereby switching it to a (poly)crystalline state (SET state and SET programming current pulse). The use of two different phases of the chalcogenure alloy in a memory cell is based on the recognition that the crystalline phase has a low electrical resistance (e.g., by convention corresponding to logic 1 or SET state) and the amorphous phase has a high electrical resistance (e.g., by convention corresponding to logic 0 or RESET state).

Therefore, the SET and RESET operations of a memory cell in a phase-change memory are used to change the content of the cell from "0" to "1" and vice versa, by applying a controlled programming current with a defined shape to allow the memory storage element to change its state from non-conducting (having a high electrical resistance) to conducting (having a low electrical resistance) and vice versa, by changing its morphology from amorphous to (poly)crystalline and vice versa.

During the SET and RESET pulses, the programming current through the memory cell is expected to have a defined plateau so as to produce a controlled variation of the temperature of the memory storage element. Therefore, a driver circuit is used to inject the desired current in the memory storage element, starting from a reference current generated by a current digital-to-analog converter (IDAC).

The coupling effects between a conventional driver circuit and a phase-change memory cell may result in overshoot events of the programming current (in the SET pulses and/or in the RESET pulses). Overshoot events may compromise the write process (e.g., programming process) of the phase-change memory cells.

Therefore, there is a need in the art to provide improved driver circuits for phase-change memory cells, and methods that facilitate compensating possible overshoot events of the programming current in the SET and/or RESET pulses.

SUMMARY

Embodiments provide driver circuits and methods for phase-change memory cells.

One or more embodiments may relate to a corresponding method of driving a plurality of memory cells.

In one or more embodiments, a circuit comprises a plurality of memory cells. Each memory cell in the plurality of memory cells includes a phase-change memory storage element coupled in series with a respective current-modulating transistor between a supply voltage node and a reference voltage node. The current-modulating transistors are configured to receive a drive signal at a control terminal thereof and to inject respective programming currents into the respective phase-change memory storage elements as a function of the drive signal. The circuit comprises a driver circuit configured to produce the drive signal at a common control node, the common control node being coupled to the control terminals of the current-modulating transistors in the plurality of memory cells. The drive signal modulates the programming currents to produce SET programming current pulses and RESET programming current pulses. The circuit comprises at least one current generator circuit configured to inject a compensation current into the common control node in response to the current-modulating transistors injecting the programming currents into the respective phase-change memory storage elements.

One or more embodiments thus facilitate compensating possible overshoot events of the programming current in the SET and/or RESET pulses.

In one or more embodiments, each memory cell in the plurality of memory cells may include a respective electronic switch coupled in series with the phase-change memory storage element and the current-modulating transistor. The respective electronic switches may be configured to receive a control signal and to be activated (e.g., made conductive) in response to the control signal being asserted to enable injection of the programming currents into the respective phase-change memory storage elements.

In one or more embodiments, the circuit may comprise a logic circuit configured to assert a compensation activation signal in response to the control signal being asserted. The at least one current generator circuit may be configured to receive the compensation activation signal and to inject the compensation current into the common control node in response to the compensation activation signal being asserted.

In one or more embodiments, the logic circuit may be configured to de-assert the compensation activation signal upon expiry of a compensation time interval (e.g., shorter than the SET programming current pulses and RESET programming current pulses).

In one or more embodiments, the at least one current generator circuit may comprise a first transistor and a second transistor coupled in series between the supply voltage node and the common control node. The first transistor may be selectively activatable as a function of a respective selection signal and the second transistor may be selectively activatable as a function of the compensation activation signal.

In one or more embodiments, the circuit may comprise a plurality of current generator circuits selectively activatable to modulate the magnitude of the compensation current injected into the common control node.

In one or more embodiments, the current generator circuits in the plurality of current generator circuits may be selectively activatable as a function of the number of memory cells in the plurality of memory cells.

In one or more embodiments, the number of activated current generator circuits in the plurality of current generator circuits may be proportional to the number of memory cells in the plurality of memory cells.

In one or more embodiments, the at least one current generator circuit may be trimmed as a function of process variations.

In one or more embodiments, the circuit may comprise a process detector circuit configured to detect process variations during the operating life of the circuit, and the at least one current generator circuit may be trimmed as a function of said detected process variations.

In one or more embodiments, a method of driving a plurality of memory cells in a circuit according to one or more embodiments may comprise:
  producing a drive signal at the common control node;
  receiving the drive signal at the control terminals of the current-modulating transistors;
  injecting respective programming currents into the respective phase-change memory storage elements as a function of the drive signal, wherein the drive signal modulates the programming currents to produce SET programming current pulses and RESET programming current pulses; and
  injecting a compensation current into the common control node in response to the current-modulating transistors injecting the programming currents into the respective phase-change memory storage elements.

BRIEF DESCRIPTION OF THE DRAWINGS

One or more embodiments will now be described, by way of example only, with reference to the annexed figures, wherein:

FIG. 1 is a time diagram exemplary of the expected behavior of the programming current of a phase-change memory cell during a SET pulse;

FIG. 2 is a time diagram exemplary of the expected behavior of the programming current of a phase-change memory cell during a RESET pulse;

FIG. 3 is a circuit block diagram exemplary of a driver circuit for programming a phase-change memory;

FIG. 4 is a time diagram exemplary of signals in a driver circuit as exemplified in FIG. 3;

DETAILED DESCRIPTION OF ILLUSTRATIVE EMBODIMENTS

Figure 5:
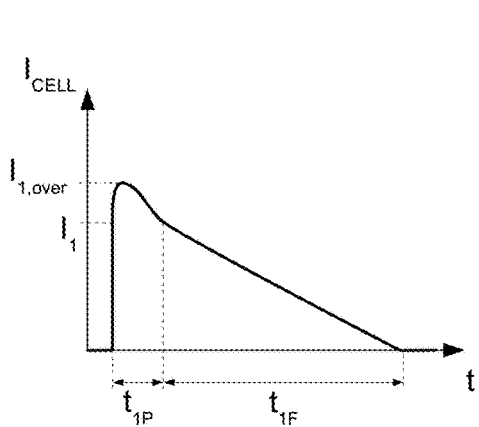
FIG. 5 is a time diagram exemplary of the behavior of the programming current of a phase-change memory cell during a SET pulse in case of an overshoot event.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

As used herein, the word "asserted" means that a signal has the logic level required to turn on or activate the component to which it is passed. For example, an "asserted" signal turns on a transistor, regardless of whether the transistor is n-channel or p-channel; similarly, an "asserted" signal closes a switch.

By way of introduction to the detailed description of exemplary embodiments, reference may first be made to FIGS. 1 to 7.

FIG. 1 is a time diagram exemplary of the expected behavior of the programming current $I_{CELL}$ of a phase-change memory cell during the SET pulse. The programming current $I_{CELL}$ during the SET pulse is expected to increase rapidly from zero to a plateau value $I_1$, maintain the value $I_1$ for a time interval $t_{1P}$, and then slowly return (e.g., fall) to zero during a time interval $t_{1F}$.

FIG. 2 is a time diagram exemplary of the expected behavior of the programming current $I_{CELL}$ of a phase-change memory cell during the RESET pulse. The programming current $I_{CELL}$ during the RESET pulse is expected to increase rapidly from zero to a plateau value $I_2$ (e.g., higher than $I_1$), maintain the value $I_2$ for a time interval $t_{2P}$(e.g., equal to $t_{1P}$), and then rapidly return (e.g., fall) to zero.

In conventional applications, the current values $I_1$ and $I_2$ and the time intervals $t_{1P}$, $t_{1F}$ and $t_{2P}$ may have the following exemplary values: $I_2$=200 µA (e.g., for the first RESET pulse), $I_1$=120 µA (e.g., for the first SET pulse), $t_{1P}$=100 ns, $t_{1F}$=2.8 µs, and $t_{2P}$=100 ns.

FIG. 3 is a circuit block diagram exemplary of the architecture of a driver circuit for programming a phase-change memory. The driver circuit may comprise a current output digital-to-analog converter 30 (IDAC) coupled to a driver circuit 32 configured to produce a drive signal DRV_GATE. A memory cell C1 of the phase-change memory may comprise a first transistor PH1, a second transistor PC1 and a memory storage element E1 (e.g., including a phase-change material such as GST) coupled in series between a supply voltage node that supplies a voltage $V_{SUPPLY}$ (e.g., equal to 3.2 V during the first SET pulse, 3.9 V during the first RESET pulse, up to 4.7 V during the third RESET pulse) and a reference voltage node (not visible in the Figures annexed herein).

The first transistor PH1 may comprise a high gain transistor (e.g., a p-channel MOS transistor) and may receive the drive signal DRV_GATE at its control (e.g., gate) terminal. The second transistor PC1 may comprise a control transistor (e.g., a p-channel MOS transistor smaller than PH1) and may receive a control signal PGDRV_ON at its control (e.g., gate) terminal. The control signal PGDRV_ON may switch between a first, asserted value (e.g., logic 0) and a second, de-asserted value (e.g., logic 1) so as to enable (e.g., make conductive) and disable (e.g., make non-conductive), respectively, the current path between the memory storage element E1 and the supply voltage node, thereby enabling and disabling the write operation of the memory storage element E1. The control transistor PC1 may thus operate substantially as an enablement switch. The drive signal DRV_GATE may be modulated by the driver circuit 32 so as to produce the desired pulses of the programming current $I_{CELL}$ through the memory storage element E1 when the switch PC1 is conductive.

The person skilled in the art will understand that a single memory cell C1 is exemplified in FIG. 3 for the sake of ease of illustration only, and that in one or more embodiments a plurality of N memory cells C1, . . . , CN (all having the same structure as cell C1) may be driven in parallel by the driver circuit 32 (e.g., by propagating the same drive signal DRV_GATE to all the high gain transistors PH1, . . . , PHN in the memory cells C1, . . . , CN). The parallel memory cells C1, . . . , CN may receive respective control signals PGDRV_ON. A common signal (PDPULSE) may trigger the start of operation, and a decoding scheme may select the correct program drivers. In case N program drivers need to be enabled, a number N of control signals PGDRV_ON[N:1] may be provided.

Figure 6:
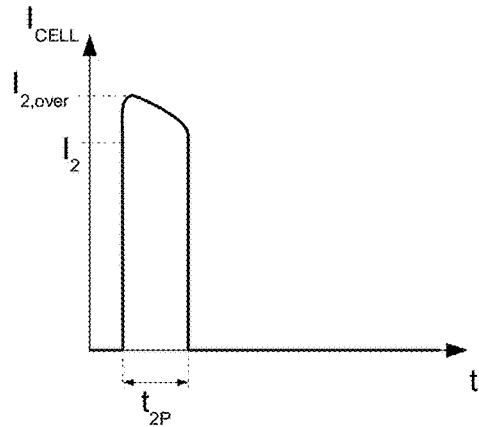
FIG. 6 is a time diagram exemplary of the behavior of the programming current of a phase-change memory cell during a RESET pulse in case of an overshoot event.

FIG. 4 is a time diagram exemplary of signals in a conventional circuit as exemplified in FIG. 3. Signals PGDRV_ON and DRV_GATE are exemplary of the control and drive signals previously discussed, applied to transistors PC1 and PH1, respectively. Signals $V_A$ and $V_B$ are voltage signals as produced at nodes NA and NB, respectively, during operation of the circuit of FIG. 3. As exemplified in FIG. 4, due to the coupling effect of the (large) high gain transistor(s) PH1 to the output node of the driver circuit 32, the drive signal DRV_GATE received at the control terminal of the transistor(s) PH1 may be affected by an undershoot when the control transistor(s) PC1 is turned on in response to the control signal PGDRV_ON being asserted (e.g., driven to a low logic value). An undershoot of the drive signal DRV_GATE may result in an overshoot of the programming current $I_{CELL}$, modifying the expected plateau values as exemplified in FIGS. 5 and 6. FIG. 5 is a time diagram exemplary of the behavior of the programming current $I_{CELL}$ of a phase-change memory cell during the SET pulse in case of an overshoot event, where the maximum (e.g., peak) current $I_{1,over}$ reached during the time interval $t_{1P}$ is higher than the expected plateau current $I_1$. FIG. 6 is a time diagram exemplary of the behavior of the programming current $I_{CELL}$ of a phase-change memory cell during the RESET pulse in case of an overshoot event, where the maximum (e.g., peak) current $I_{2,over}$ reached during the time interval $t_{2P}$ is higher than the expected plateau current $I_2$. Overshoot events in the SET and/or RESET current pulses may negatively affect the write process of the memory storage element(s) E1, e.g., causing loss of data.

It is noted that the higher is the number of memory cells C1, . . . , CN to program (e.g., write) in parallel, the higher can be the magnitude of the current overshoot (i.e., the difference between $I_{1,over}$ and $I_1$ during a SET pulse, or between $I_{2,over}$ and $I_2$ during a RESET pulse). Therefore, the programming current overshoot events may be opposed by resorting to a write process where the N memory cells to be written at the same time are programmed sequentially, one after the other, as exemplified in the circuit block diagram of FIG. 7.

Figure 7:
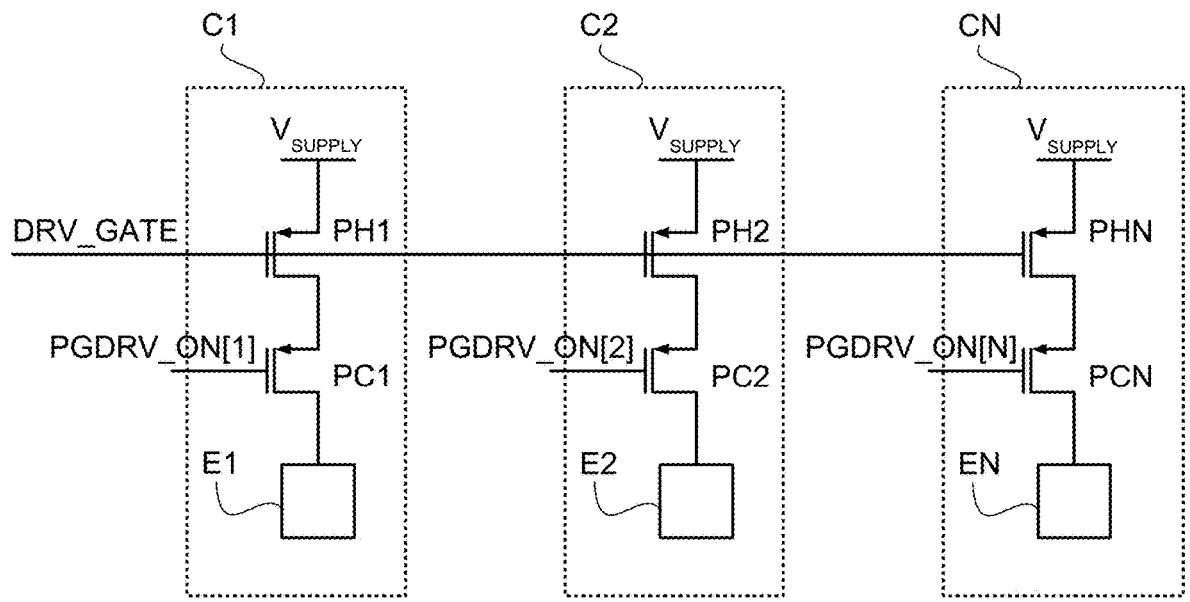
FIG. 7 is a circuit diagram exemplary of a driver circuit architecture for a phase-change memory comprising a plurality of memory cells.

As exemplified in FIG. 7, the high gain transistors PH1, PH2, . . . , PHN of a set of N memory cells C1, C2, . . . , CN to be programmed at the same time may receive at their control (e.g., gate) terminals the same drive signal DRV_GATE. The control transistors PC1, PC2, . . . , PCN of the set of N memory cells C1, C2, . . . , CN may receive at their control (e.g., gate) terminals respective control signals PGDRV_ON[1], PGDRV_ON[2], . . . , PGDRV_ON[N]. By sequentially enabling the control transistors PC1, PC2, . . . , PCN via the control signals PGDRV_ON[i], PGDRV_ON[2], . . . , PGDRV_ON[N], the current overshoot events may be mitigated, but the overall write time is increased, since the N memory cells C1, C2, . . . , CN are not programmed in parallel. A delay may therefore be introduced in the write process of the phase-change memory.

Figure 8:
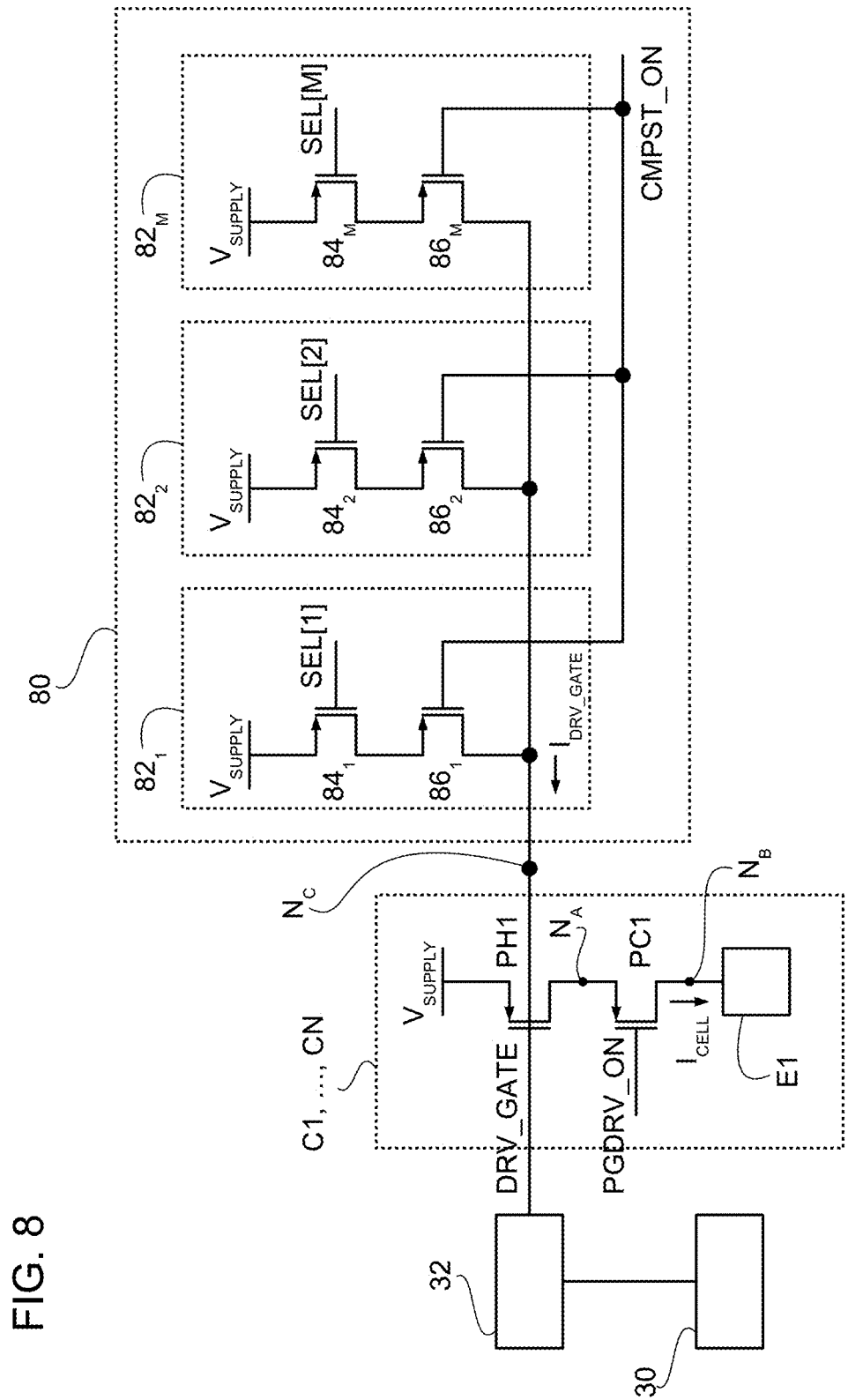
FIG. 8 is a circuit block diagram exemplary of a driver circuit for programming a phase-change memory according to one or more embodiments of the present description.

FIG. 8 is a circuit block diagram exemplary of a driver circuit for phase-change memory cells according to one or more embodiments, which aim at reducing the current overshoot events without introducing a delay in the write process of plural memory cells.

Similarly to the architecture discussed with reference to FIG. 3, one or more embodiments may comprise a current output digital-to-analog converter 30 (IDAC) coupled to a driver circuit 32 configured to generate a drive signal DRV_GATE. A memory cell C1 of the phase-change memory may comprise a first transistor PH1, a second transistor PC1 and a memory storage element E1 (e.g., including a phase-change material such as GST) coupled in series between a supply voltage node that supplies a voltage $V_{SUPPLY}$ and a reference voltage node (not visible in the Figures annexed herein). The first transistor PH1 may comprise a high gain transistor (e.g., a p-channel MOS transistor) and may receive the drive signal DRV_GATE at its control (e.g., gate) terminal. The transconductance $g_m$ of the transistor PH1 may be, for instance, around 860 µA/V. Transistor PH1 may be a relatively large transistor, e.g., having a channel width of around 120 µm and a channel length of around 1.6 µm. For instance, transistor PH1 may comprise two transistors arranged in series, each having a channel width of around 120 µm and a channel length of around 0.85 µm. The second transistor PC1 may comprise a control transistor (e.g., a p-channel MOS transistor smaller than PH1) and may receive the control signal PGDRV_ON at its control (e.g., gate) terminal. Transistor PC1 may be a relatively small transistor, e.g., having a channel width of around 30 μm and a channel length of around 0.35 μm. The control signal PGDRV_ON may switch between a first, asserted value (e.g., logic 0) and a second, de-asserted value (e.g., logic 1) so as to enable (e.g., make conductive) and disable (e.g., make non-conductive), respectively, the current path between the memory storage element E1 and the supply voltage node, thereby enabling and disabling the write operation of the memory storage element E1. The control transistor PC1 may thus operate substantially as an enablement switch. The drive signal DRV_GATE may be modulated by the driver circuit 32 so as to produce the desired pulses of the programming current $I_{CELL}$ through the memory storage element E1 when the switch PC1 is conductive.

Again, the person skilled in the art will understand that a single memory cell C1 is exemplified in FIG. 8 for the sake of ease of illustration only, and that in one or more embodiments a plurality of N memory cells C1, . . . , CN (all having the same structure as cell C1) may be driven in parallel by the driver circuit 32 (e.g., by propagating the same drive signal DRV_GATE to all the high gain transistors H1, . . . , PHN in the memory cells C1, . . . , CN).

As exemplified in FIG. 8, one or more embodiments may comprise compensation circuitry 80 configured to compensate undershoot events of the drive signal DRV_GATE and in turn mitigate overshoot events of the programming current of the memory storage elements in the cells C1, . . . , CN.

The compensation circuitry 80 may comprise a set of current generator circuits $82_1$, $82_2$, . . . , $82_M$ (e.g., a number M of current generator circuits, equal to or different from the number N of memory cells C1, . . . , CN driven in parallel by the driver circuit 32) configured to selectively inject respective currents into the control (e.g., gate) terminals of the high gain transistors PH1, . . . , PHN of the memory cells C1, . . . , CN.

For instance, as exemplified in FIG. 8, each current generator circuit 82 may comprise a first transistor 84 ($84_1$, $84_2$, . . . , $84_M$) and a second transistor 86 ($86_1$, $86_2$, . . . , $86_M$) coupled in series between the supply voltage node that supplies voltage $V_{SUPPLY}$ and a control node $N_C$. The control node $N_C$ is coupled to the (gate) control terminals of the transistors PH1, . . . , PHN and is driven by the output of the driver circuit 32. The transistors $84_1$, $84_2$, . . . , $84_M$ may comprise p-channel MOS transistors and may receive respective selection signals SEL[1], SEL[2], . . . , SEL[M] at their control (e.g., gate) terminals. The transistors $86_1$, $86_2$, . . . , $86_M$ may comprise p-channel MOS transistors and may receive a same compensation activation signal CMPST_ON at their control (e.g., gate) terminals.

The compensation activation signal CMPST_ON may switch between a first, asserted value (e.g., logic 0) and a second, de-asserted value (e.g., logic 1) so as to enable or disable all the current generator circuits $82_1$, $82_2$, . . . , $82_M$ (i.e., substantially enabling and disabling the programming current compensation function). The selection signals SEL[1], SEL[2], . . . , SEL[M] may switch between a first, asserted value (e.g., logic 0) and a second, de-asserted value (e.g., logic 1) so as to enable or disable the respective current generator $82_1$, $82_2$, . . . , $82_M$ (i.e., substantially allowing modulation of the compensation current $I_{DRV\_GATE}$ injected into node $N_C$ by the compensation circuitry 80).

Therefore, in one or more embodiments a compensation current $I_{DRV\_GATE}$ can be injected in the control node $N_C$ to compensate undershoot events of the drive signal DRV_GATE. The compensation current may be injected for a defined time interval that may be shorter than the duration of the whole SET pulse or RESET pulse. By way of example, the compensation time interval may last some nanoseconds (1 ns=$10^{-9}$ s), e.g., 3 ns to 5 ns. Substantially, the compensation activation signal CMPST_ON may be asserted (e.g., asserted low) for a certain time interval (e.g., fixed or programmable) in response to a falling edge of the control signal PGDRV_ON. While the compensation activation signal CMPST_ON is asserted (low) and the current generators $82_1$, $82_2$, . . . , $82_M$ are consequently enabled, a compensation current $I_{DRV\_GATE}$ is injected into node $N_C$ to reduce the undershoot of the drive signal DRV_GATE and facilitate a fast recovery of the expected level of the drive signal DRV_GATE, thereby controlling the plateau of the programming current $I_{CELL}$ flowing through the memory storage elements E1, . . . , EN.

Figure 9:
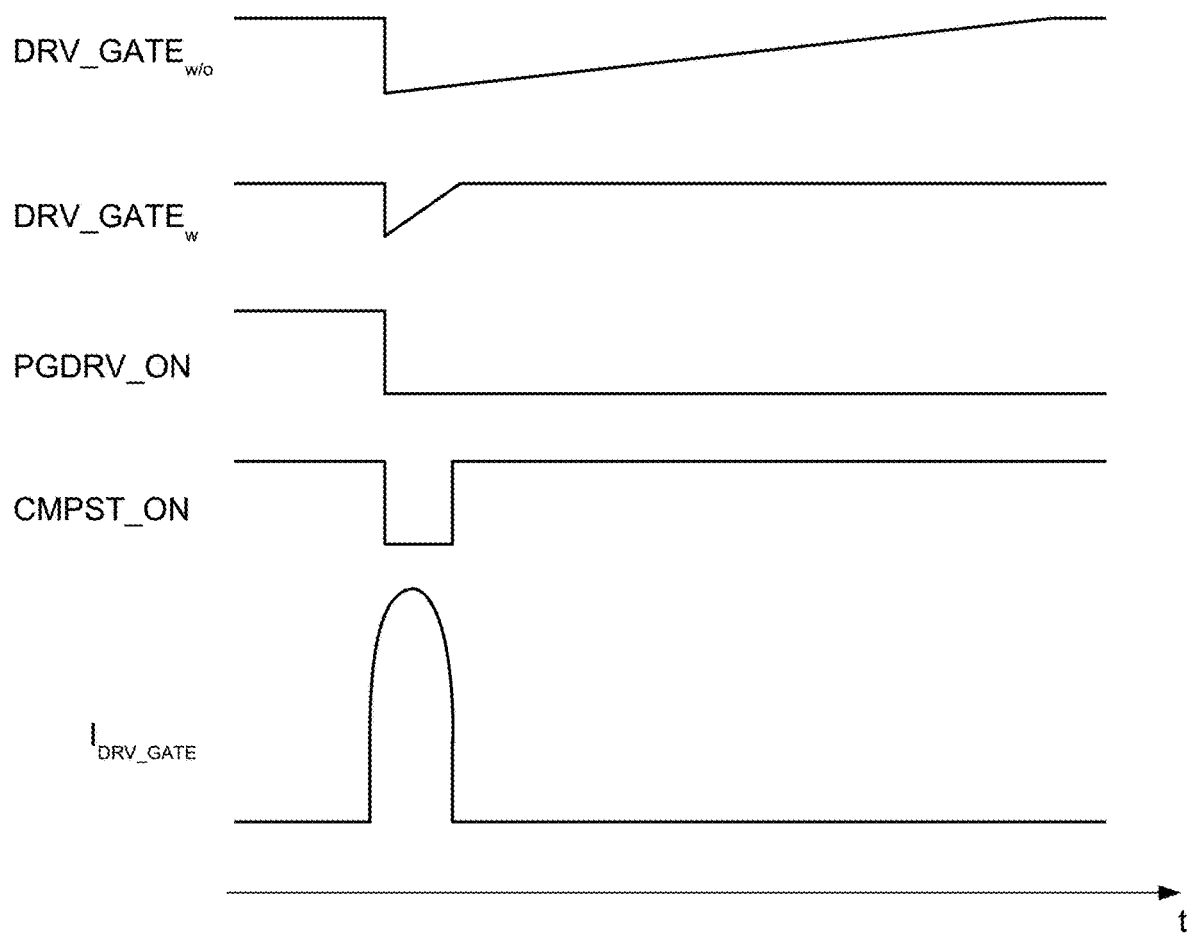
FIG. 9 is a time diagram exemplary of signals in a driver circuit as exemplified in FIG. 8.

Operation as discussed above is exemplified in FIG. 9, which includes time diagrams exemplary of the following signals:

DRV_GATE$_{w/o}$: drive signal at node $N_C$ if compensation of the programming current $I_{CELL}$ is disabled;

DRV_GATE$_w$: drive signal at node $N_C$ if compensation of the programming current $I_{CELL}$ is enabled;

PGDRV_ON: control signal received at one or more of the control transistors PC1, . . . , PCN of the memory cells C1, . . . , CN;

CMPST_ON: active-low compensation activation signal received at transistors $86_1$, $86_2$, . . . , $86_M$ of the current generators $82_1$, $82_2$, . . . , $82_M$; and $I_{DRV\_GATE}$: overall compensation current injected into node $N_C$ by the current generators $82_1$, $82_2$, . . . , $82_M$ (i.e., by the compensation circuit 80).

In one or more embodiments, the magnitude of the compensation current $I_{DRV\_GATE}$ may be selected as a function of certain parameters. It is noted that the magnitude of the undershoot of the drive signal DRV_GATE may depend mainly on two factors—the number N of memory cells C1, . . . , CN to be written (e.g., programmed) in parallel, and the process variations. The faster the process and the higher the number N of memory cells to write, the higher may be the undershoot of the drive signal DRV_GATE, resulting in a higher overshoot of the SET/RESET current pulses.

Therefore, in one or more embodiments where a plurality of M current generators $82_1$, $82_2$, . . . , $82_M$ is provided in the compensation circuit 80, one or more of said current generators may be enabled at the same time by properly driving the selection signals SEL[1], SEL[2], . . . , SEL[M] as a function of the number of memory cells to write in parallel. Generally, the higher the number of memory cell, the higher the number of enabled current generators, e.g., according to a proportionality relationship.

For instance, if a single memory cell C1 is driven by the driver circuit 32, a single current generator $82_1$ may be enabled by setting SEL[1]=0 and all the other selection signals SEL[2], . . . , SEL[M]=1. If two memory cells C1, C2 are driven by the driver circuit 32, two current generators $82_1$, $82_2$ may be enabled by setting SEL[1], SEL[2]=0 and all the remaining selection signals SELL[3], . . . , SEL[M]=1. In general, the relationship between the number of cells to write in parallel and the number of enabled current generators 82 may vary in different embodiments. For instance, a certain number of memory cells can be grouped to be programmed while activating a single compensation current generator 82. Purely by way of example, one or more embodiments may comprise M=5 current generators 82, corresponding to five different groups of memory cells. For instance, fourteen, fifteen or sixteen memory cells in parallel may receive the same compensation current injection from a single current generator 82.

Additionally or alternatively, in one or more embodiments, the transistors $86_1$, $86_2$, . . . , $86_M$ may have a trimmable channel width (e.g., by providing plural transistors in parallel, each of which has a channel width W). For instance, transistor $86_1$ may have a channel width of $W*N_1$, transistor $86_2$ may have a channel width of $W*N_2$, and so on up to transistor $86_M$ that may have a channel width of $W*N_M$. In one or more embodiments, the values of parameters $N_1$, $N_2$, . . . , $N_M$ may be selected to trim the width of the corresponding transistors so as to compensate process variation.

In one or more embodiments, trimming of transistors $86_1$, $86_2$, . . . , $86_M$ may be performed at the end of the fabrication process by doing certain measurements of the transistor's electrical characteristics. Additionally or alternatively, a process detector provided on board of the device may adjust the width of transistors $86_1$, $86_2$, . . . , $86_M$ during the life of the device.

Figure 10:
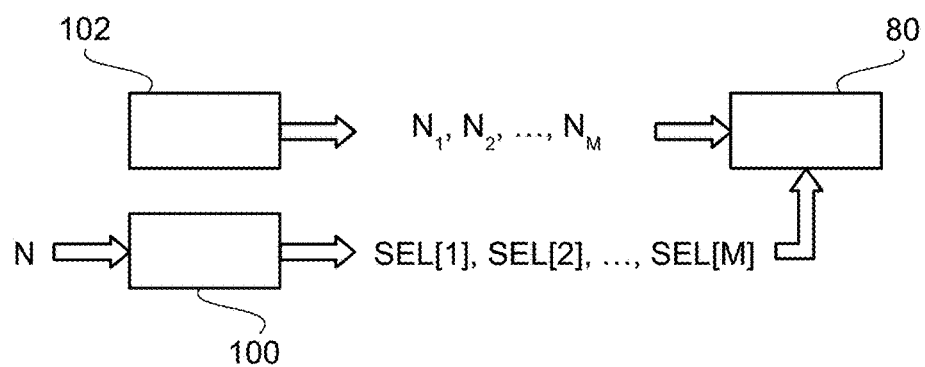
FIG. 10 is a block diagram exemplary of a process for determining the value of a compensation current in one or more embodiments of the present description.

FIG. 10 is a block diagram exemplary of a process for determining the value of the compensation current $I_{DRV\_GATE}$ in one or more embodiments. As exemplified in FIG. 10, a logic circuit 100 (e.g., included in the memory driver circuit) may receive as input the number N of memory cells C1, . . . , CN to be written (e.g., programmed) in parallel by the driver circuit 32. The logic circuit 100 may produce (e.g., assert and de-assert) the selection signals SEL[1], SEL[2], . . . , SEL[M] as a function of the input number N (e.g., setting to an "enable" state one or more of the selection signals SEL, possibly proportionally to N). Additionally or alternatively, a process detector circuit 102 may detect process variations and may determine the values of parameters $N_1$, $N_2$, . . . , $N_M$ suitable to trim the width of the transistors $86_1$, $86_2$, . . . , $86_M$. The compensation circuit 80 may thus be driven and/or trimmed as a function of the selection signals SEL[1], SEL[2], . . . , SEL[M] and/or the trimming parameters $N_1$, $N_2$, . . . , $N_M$.

Figure 11A:
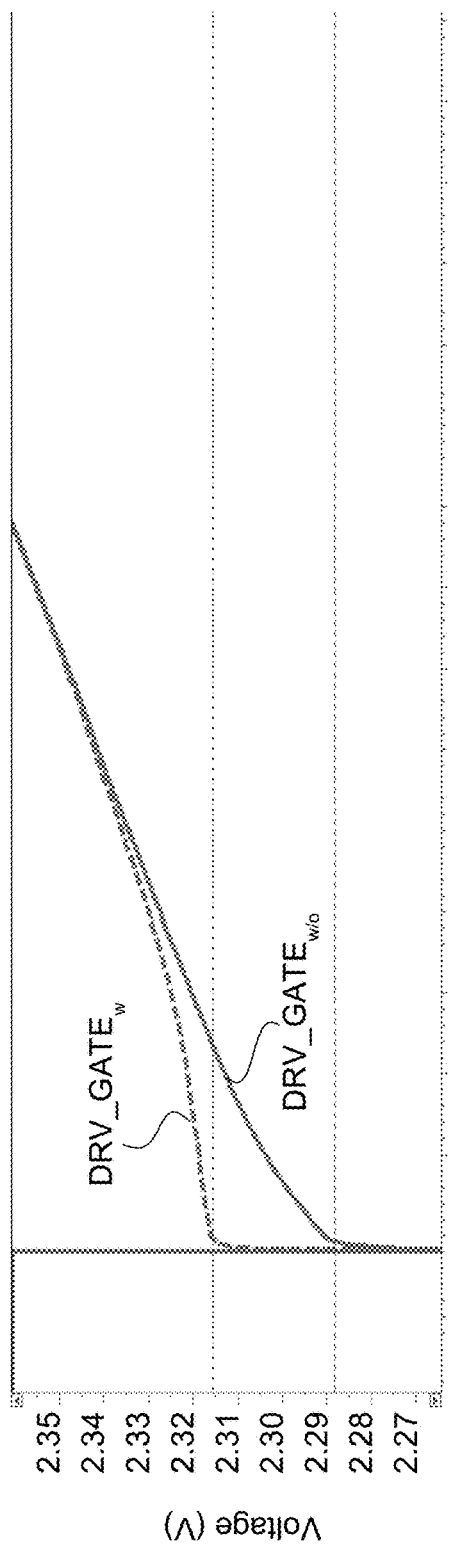
FIG. 11A is a time diagram exemplary of a comparison between a memory cell drive signal in the case of no compensation of the memory cell programming current and the same drive signal in the case of compensation of the memory cell programming current.

FIG. 11A is a time diagram that exemplifies a comparison between the drive signal DRV_GATE when no compensation of the programming current is applied (solid line, signal $DRV\_GATE_{w/o}$) and the drive signal DRV_GATE when the compensation of the programming current is applied (dashed line, signal $DRV\_GATE_w$) during a SET pulse in an exemplary case of a 16-bit memory (i.e., a memory including 16 memory cells driven in parallel by the same driver circuit 32). As exemplified in FIG. 11A, the drive signal DRV_GATE may drop from 2.36 V to about 2.29 V if no compensation is applied, and from 2.36 V to about 2.32 V if compensation is applied.

Figure 11B:
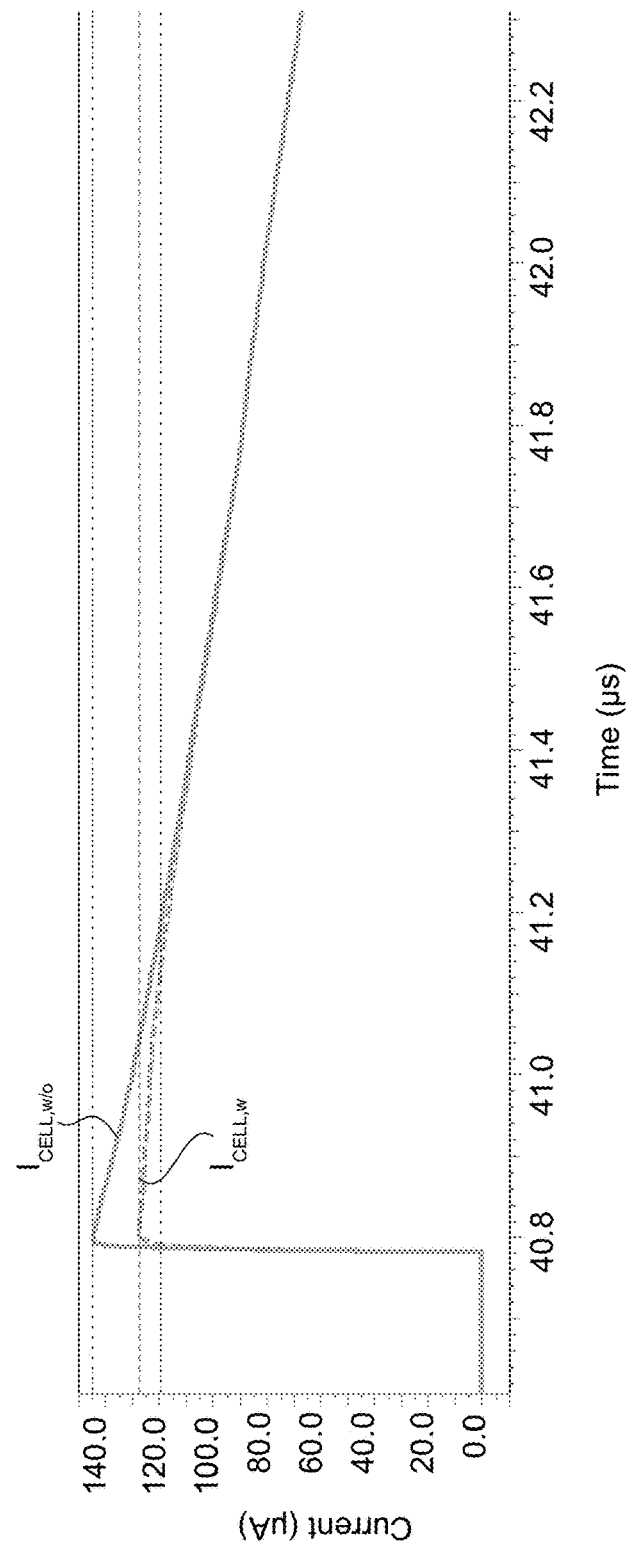
FIG. 11B is a time diagram exemplary of a comparison between a memory cell programming current in the case of no compensation of the memory cell programming current and the same programming current in the case of compensation of the memory cell programming current.

FIG. 11B is a time diagram that exemplifies a comparison between the programming current $I_{CELL}$ when no compensation of the programming current is applied (solid line, signal $I_{CELL,w/o}$) and the programming current $I_{CELL}$ when the compensation of the programming current is applied (dashed line, signal $I_{CELL,w}$) during a SET pulse in an exemplary case of a 16-bit memory (i.e., a memory including 16 memory cells driven in parallel by the same driver circuit 32). As exemplified in FIG. 11B, the programming current $I_{CELL}$ may increase from the expected plateau value 120 µA to about 145 µA (+21%) if no compensation is applied, and from 120 µA to about 128 µA (+6.5%) if compensation is applied. Therefore, one or more embodiments may reduce the programming current overshoot, e.g., from +21% to +6.5%.

One or more embodiments may thus provide one or more of the following advantages:

reducing the programming current overshoot without introducing a delay in the write process of the phase-change memory;

small area of the circuitry that compensates the programming current; and high reliability of the write process of the phase-change memory.

Without prejudice to the underlying principles, the details and embodiments may vary, even significantly, with respect to what has been described by way of example only, without departing from the extent of protection.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:

a plurality of memory cells, wherein each memory cell in the plurality of memory cells includes a phase-change memory storage element coupled in series with a respective current-modulating transistor between a supply voltage node and a reference voltage node, the current-modulating transistors being configured to receive a drive signal at a control terminal and to inject respective programming currents into the respective phase-change memory storage element as a function of the drive signal;

a driver circuit configured to produce the drive signal at a common control node, wherein the common control node is coupled to the control terminals of the current-modulating transistors in the plurality of memory cells, the drive signal modulating the programming currents to produce SET programming current pulses and RESET programming current pulses; and at least one current generator circuit configured to inject a compensation current for the programming currents into the common control node in response to the current-modulating transistors injecting the programming currents into the respective phase-change memory storage elements.

2. The circuit of claim 1, wherein each memory cell in the plurality of memory cells includes a respective electronic switch coupled in series with the phase-change memory storage element and the current-modulating transistor, the respective electronic switches being configured to receive a control signal and to be activated in response to the control signal thereby enabling injection of the programming currents into the phase-change memory storage elements.

3. The circuit of claim 2, further comprising a logic circuit configured to assert a compensation activation signal in response to the control signal, wherein the at least one current generator circuit is configured to receive the compensation activation signal and to inject the compensation current into the common control node in response to the compensation activation signal.

4. The circuit of claim 3, wherein the logic circuit is configured to de-assert the compensation activation signal upon expiry of a compensation time interval.

5. The circuit of claim 3, wherein the at least one current generator circuit comprises a first transistor and a second transistor coupled in series between the supply voltage node and the common control node, and wherein the first transistor is selectively activatable as a function of a respective selection signal and the second transistor is selectively activatable as a function of the compensation activation signal.

6. The circuit of claim 1, further comprising a plurality of current generator circuits selectively activatable to modulate a magnitude of the compensation current injectable into the common control node.

7. The circuit of claim 6, wherein the current generator circuits in the plurality of current generator circuits are selectively activatable as a function of N memory cells in the plurality of memory cells.

8. The circuit of claim 7, wherein a number of activated current generator circuits in the plurality of current generator circuits is proportional to the N memory cells in the plurality of memory cells.

9. The circuit of claim 1, wherein the at least one current generator circuit is trimmed as a function of process variations.

10. The circuit of claim 1, further comprising a process detector circuit configured to detect process variations during an operating life of the circuit, and wherein the at least one current generator circuit is trimmed as a function of the detected process variations.

11. A method for driving a plurality of memory cells, wherein each memory cell in the plurality of memory cells includes a phase-change memory storage element coupled in series with a respective current-modulating transistor between a supply voltage node and a reference voltage node, and wherein control terminals of the current-modulating transistor in the plurality of memory cells are coupled to a common control node, the method comprising:
  providing a drive signal at the common control node;
  receiving the drive signal at the control terminals of the current-modulating transistors;
  injecting respective programming currents into the respective phase-change memory storage elements as a function of the drive signal, wherein the drive signal modulates the programming currents to produce SET programming current pulses and RESET programming current pulses; and
  injecting a compensation current for the programming currents into the common control node in response to the current-modulating transistors injecting the programming currents into the respective phase-change memory storage elements.

12. The method of claim 11, wherein each memory cell in the plurality of memory cells includes a respective electronic switch coupled in series with the respective phase-change memory storage element and the respective current-modulating transistor, wherein the method further comprises:
  receiving, by the electronic switches, a control signal thereby activating the electronic switches; and
  enabling, by the respective electronic switches, injection of the programming currents into the phase-change memory storage elements.

13. The method of claim 12, further comprising:
  asserting, by a logic circuit, a compensation activation signal in response to the control signal;
  receiving, by at least one current generator circuit, the compensation activation signal; and
  injecting, by the at least one current generator circuit, the compensation current into the common control node in response to the compensation activation signal.

14. The method of claim 13, further comprising de-asserting, by the logic circuit, the compensation activation signal upon expiry of a compensation time interval.

15. The method of claim 13, wherein the at least one current generator circuit comprises a first transistor and a second transistor coupled in series between the supply voltage node and the common control node, and wherein the first transistor is selectively activatable as a function of a respective selection signal and the second transistor is selectively activatable as a function of the compensation activation signal.

16. The method of claim 13, wherein the at least one current generator circuit is trimmed as a function of process variations.

17. The method of claim 13, further comprising:
  detecting, by a process detection circuit, process variations during an operating life of a circuit comprising the plurality of memory cells; and
  trimming the at least one current generator circuit as a function of the detected process variations.

18. The method of claim 11, further comprising modulating, by selectively activating a plurality of current generator circuits, a magnitude of the compensation current injectable into the common control node.

19. The method of claim 18, wherein the current generator circuits in the plurality of current generator circuits are selectively activatable as a function of N memory cells in the plurality of memory cells.

20. The method of claim 19, wherein a number of activated current generator circuits in the plurality of current generator circuits is proportional to the N memory cells in the plurality of memory cells.

* * * * *